(12) United States Patent
Shi

(10) Patent No.: US 7,687,798 B2
(45) Date of Patent: Mar. 30, 2010

(54) EPITAXY WITH COMPLIANT LAYERS OF GROUP-V SPECIES

(75) Inventor: Binqiang Shi, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 255 days.

(21) Appl. No.: 11/392,331

(22) Filed: Mar. 28, 2006

(65) Prior Publication Data

US 2006/0243195 A1 Nov. 2, 2006

Related U.S. Application Data

(62) Division of application No. 09/851,839, filed on May 9, 2001, now Pat. No. 7,060,131.

(51) Int. Cl.
*H01L 29/00* (2006.01)

(52) U.S. Cl. ............... 257/9; 257/15; 257/18; 257/E29.193; 117/84; 117/90; 117/92; 117/94; 117/97; 117/103; 117/106; 117/108

(58) Field of Classification Search ............ 257/9, 257/18, 15, E29.193; 117/84, 90, 92, 94, 117/97, 103, 106, 108
See application file for complete search history.

(56) References Cited

U.S. PATENT DOCUMENTS

| | | | | |
|---|---|---|---|---|
| 3,941,624 A | 3/1976 | Cho | ............ | 117/105 |
| 4,330,360 A | 5/1982 | Kubiak et al. | ............ | 117/108 |
| 4,470,192 A | 9/1984 | Miller | ............ | 117/106 |
| 4,575,462 A | 3/1986 | Dobson et al. | ............ | 117/105 |
| 4,645,689 A | 2/1987 | Cox | ............ | 117/91 |
| 4,824,518 A | 4/1989 | Hayakawa et al. | ............ | 117/106 |
| 4,876,218 A * | 10/1989 | Pessa et al. | ............ | 117/105 |
| 4,897,367 A | 1/1990 | Ogasawara | ............ | 117/108 |
| 5,094,974 A | 3/1992 | Grunthaner et al. | ............ | 117/105 |
| 5,221,367 A | 6/1993 | Chisholm et al. | ............ | 117/105 |
| 5,294,287 A | 3/1994 | Chang et al. | ............ | 117/108 |
| 5,432,124 A | 7/1995 | Nishikata et al. | ............ | 117/106 |
| 5,538,702 A | 7/1996 | Smith et al. | ............ | 423/210 |
| 5,592,501 A * | 1/1997 | Edmond et al. | ............ | 372/45.011 |
| 5,656,540 A | 8/1997 | Nomura et al. | ............ | 117/104 |

OTHER PUBLICATIONS

Board of Patent Appeal and Interferences, Decision in U.S. Appl. No. 09/851,839 (2005), p. 1-9.*

* cited by examiner

*Primary Examiner*—Robert M Kunemund
*Assistant Examiner*—Matthew J Song

(57) ABSTRACT

The present invention relates a method for epitaxial growth of a second group III-V crystal having a second lattice constant over a first group III-V crystal having a first lattice constant, wherein strain relaxation associated with lattice-mismatched epitaxy is suppressed and thus dislocation defects do not form. In the first step, the surface of the first group III-V crystal (substrate) is cleansed by desorption of surface oxides. In the second step, a layer of condensed group-V species is condensed on the surface of the first group III-V crystal. In the third step, a mono-layer of constituent group-III atoms is deposited over the layer of condensed group-V species in order for the layer of constituent group-III atoms to retain the condensed group-V layer. Subsequently, the mono-layer of group-III atoms is annealed at a higher temperature. In the fourth step, bulk of the second group III-V crystal is grown with the condensed group-V layer accommodating the strain build-up which occurs during the bulk growth.

17 Claims, 6 Drawing Sheets

Schematic representation of how lattice mismatch is taken by a condensed layer of group-V species in this invention.

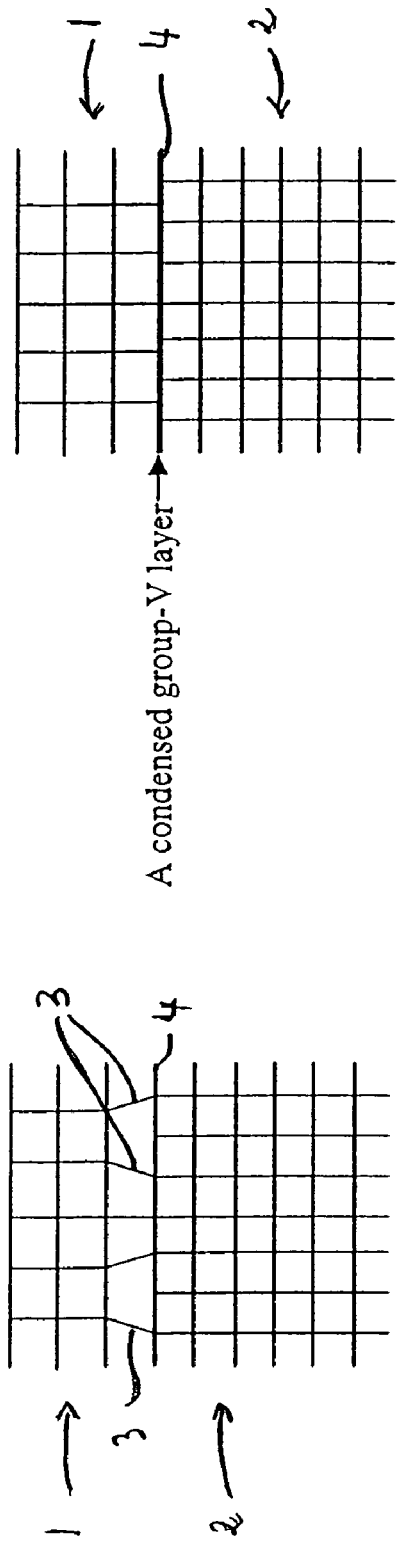
Fig. 1. A upper mismatched layer where some of the strain has relaxed by the formation of mismatch dislocations
Fig. 2. Schematic representation of how lattice mismatch is taken by a condensed layer of group-V species in this invention.

EPITAXY WITH COMPLIANT LAYERS OF GROUP-V SPECIES

CROSS-REFERENCE TO RELATED APPLICATIONS

This patent application is a divisional application of U.S. application Ser. No. 09/851,839, filed May 9, 2001 now U.S. Pat. No. 7,060,131.

TECHNICAL FIELD

This invention relates to the field of semiconductor materials, and in particular, to the growth of semiconductor crystals.

BACKGROUND OF THE INVENTION

An obstacle in realizing next-generation microelectronic and optoelectronic devices and optimal integration of these devices is found in lattice mismatches between different crystals of group III-V semiconductor materials. Generally, the lattice mismatch between a substrate and an epitaxial over-layer induces strains within the over-layer. This may lead to strain relaxation which can result in formation of material defects such as dislocations within the crystalline structure of the over-layer. FIG. 1 illustrates a mismatched over-layer 1 epitaxially grown over a substrate 2, the boundary between the over-layer 1 and the substrate 2 being indicated with reference numeral 4. As shown in FIG. 1, the lattice constant associated with the over-layer 1 is different from the lattice constant associated with the substrate 2, hence the term "mismatched over-layer". Strain relaxation due to lattice mismatch is accommodated by the formation of mismatch dislocations 3 within the crystal. Defects within a crystal generally degrade the performance of devices made from the crystal, because such defects can scatter movement of carriers (electrons and holes) and can act as carrier traps and/or recombination centers. It is thus useful to provide means for growing a crystal over-layer which has different lattice constant from the substrate on which the over-layer is grown, in such a fashion that strain relaxation does not occur and mismatch dislocations do not form. FIG. 2 is an example of this, in which the structure of over-layer 1 is preserved and no mismatch dislocations are formed.

In the prior art, two main approaches are used to address the lattice mismatch problem and the strain relaxation it causes:

1) In a first approach, defects are confined in thick relaxed buffers so that the top active layer of a device can be of a different lattice constant from that of the substrate and is as defect free as possible.

2) In a second approach, thin compliant solid layers are bonded to foreign substrates and re-growth is performed.

However, these approaches still present performance degradation problems. A buffer layer of defects degrades the quality of the active layer on top of the buffer layer used for a device. In addition, thick buffer layers are not very suitable for device fabrication because high mesa or deep isolation implants are then necessary for device isolation, and can result in high leakage currents and low wafer yields. Further, procedures for implementing the second approach are rather complicated due to problems associated with wafer bonding, fabrication of thin layers (tens of Å in thickness) and re-growth on surfaces contaminated in the wafer-bonding and fabrication processes.

Hence, there is a need for a method of growing a crystal over a substrate such that mismatch dislocations are prevented from appearing within the crystal, even though the crystal and the substrate have different lattice constants.

BRIEF DESCRIPTION OF THE INVENTION

In accordance with this invention, compliant layers of group-V species are formed in situ, which distinguishes this invention from the prior art. Indeed, in this invention, formation of compliant layers does not require wafer-bonding and fabrication procedures performed outside of the growth chamber. Furthermore, crystals grown on top of compliant layers will not be strained and therefore, will not suffer strain relaxation which results in dislocation defects.

The present invention relates to processes and methods which facilitate the epitaxial growth of group III-V crystals of different lattice constants on top of each other. One object of this invention is to suppress strain relaxation associated with lattice-mismatched epitaxy. This is realized with a growth process that initially forms a substrate surface free of oxides. The growth process then deposits, at appropriately low growth temperatures, a layer of condensed group-V species and a mono-layer of constituent group-III atoms in order for the crystal over-layer to retain the condensed layer. Subsequently, the mono-layer is annealed at a higher temperature. Finally, the bulk of the crystal over-layer is grown with the condensed group-V layer accommodating the strain build-up which occurs during the bulk growth.

In one example of the lattice-mismatch growth process, the substrate may be gallium arsenide, the condensed group-V species may be arsenic and the crystal over-layer to be grown may be indium arsenide (The lattice constant of indium arsenide differs from that of gallium arsenide by 7.2%).

In one aspect, the present invention relates to a semiconductor device comprising a substrate of a group-III/group-V material, a layer of a group-V material disposed over the substrate, a mono-layer of group-III atoms disposed over the layer of group-V material, and a layer of a group-III/group-V crystal epitaxially grown over the mono-layer.

BRIEF DESCRIPTION OF THE DRAWINGS

FIG. 1 is a schematic representation of a mismatched layer where some of the strain has relaxed by the formation of mismatched dislocations within the grown upper layer;

FIG. 2 is a schematic representation of how lattice mismatch is accommodated by a condensed layer of group-V species in accordance with this invention;

DETAILED DESCRIPTION OF THE INVENTION

In accordance with this invention, the process or method of growing of a group III-V crystal on top of another group III-V crystal (substrate), without introducing lattice-mismatch defects, include the following steps:

Step 1: Thermal Desorption Cleansing of the Substrate

In a preferred embodiment, the material forming the substrate upon which the epitaxial over-layer is to be grown may include GaAs, GaP, InAs or InP. As would be apparent to the skilled person, other group III-V compounds or crystals may be used as well.

Figure 3:
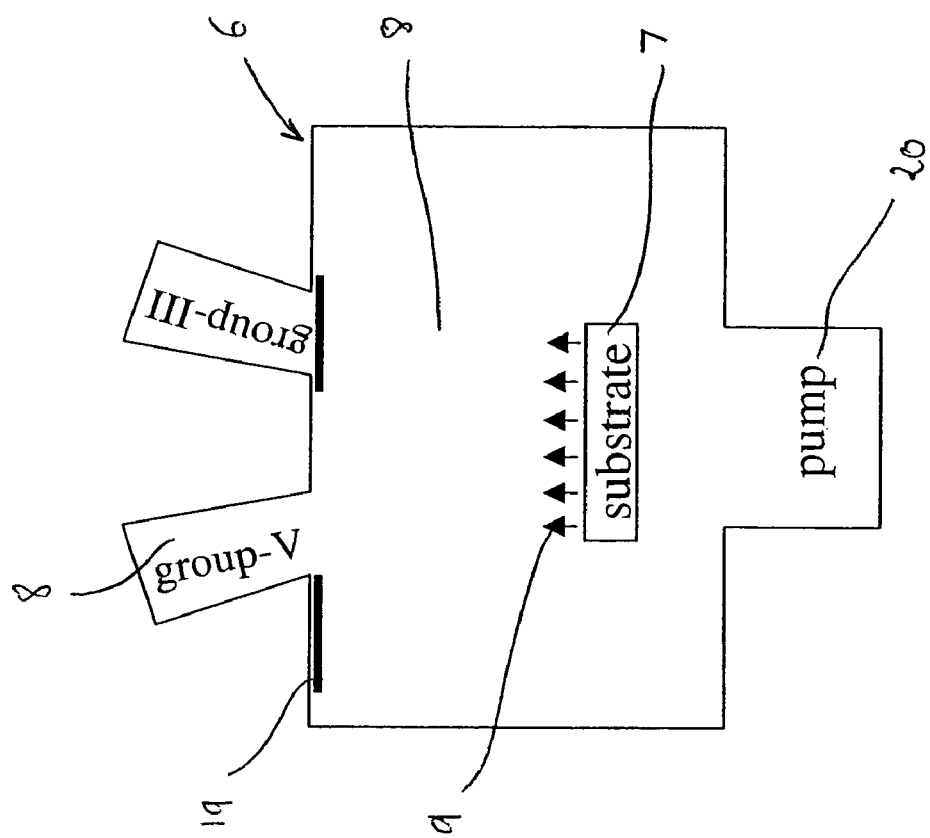
FIG. 3 is a schematic representation of the growth chamber illustrating desorption of surface oxides from the surface of the substrate.

In this step, and as illustrated by FIG. 3, the substrate 7 is first heated inside a growth chamber 6, to a temperature $T_s$, where $T_s$ ranges from about 495° C. to about 600° C. Vapor 8 comprising group-V species (e.g., $As_2$, $As_4$, $P_2$, $P_4$ or other group-V members) is introduced in the growth chamber 6 when the substrate 7 is heated. The pressure P of the vapor 8 introduced may range from about 0.004 pa to about 0.012 pa, which pressure P is larger than the vapor pressure $P_s$ of the substrate 7 at temperature $T_s$. The temperature of the vapor 8 which is introduced in the growth chamber 6, may range from about 300° C. to about 1000° C. The substrate 7 is then annealed under this over-pressure of group-V species vapor, at temperature $T_s$, and desorption of surface oxides 9 from the substrate 7 takes place, with the surface oxides being removed from the chamber by pump 20.

Step 2: In situ Introduction of Condensed Group-V Species

Figure 4:
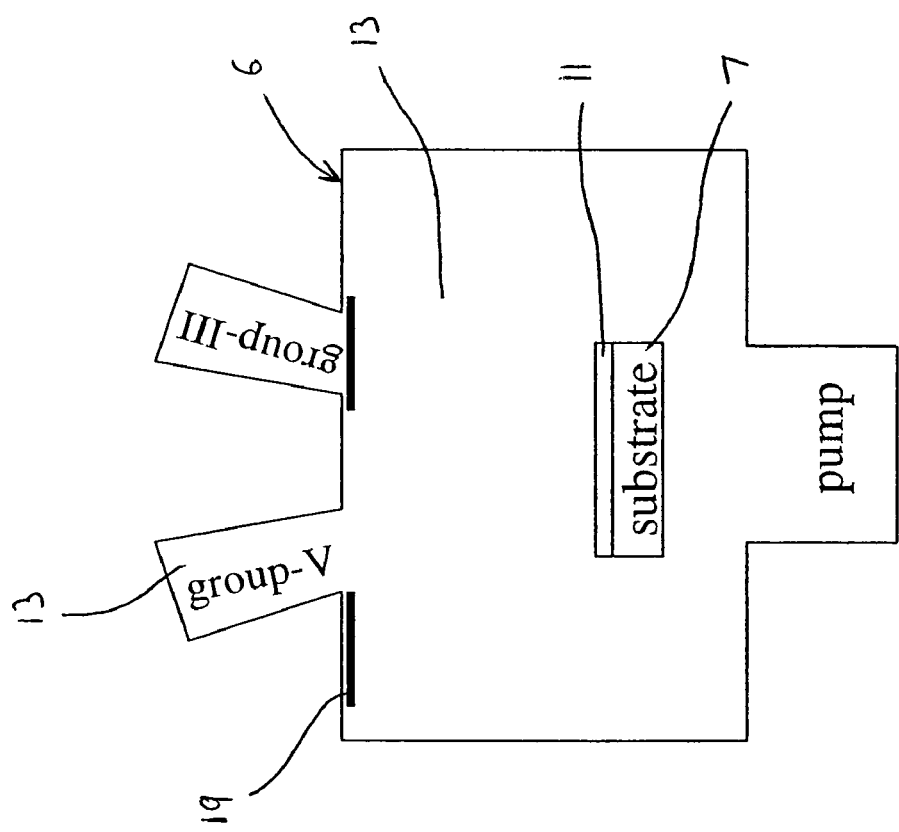
FIG. 4 is a schematic representation of the growth chamber illustrating the deposit of a first layer of group-V species over the substrate.

As shown in FIG. 4, an ultra-thin layer 11 of condensed group-V species (layer 4 of FIG. 1) which, in a preferred embodiment may comprise $As_2$, $As_4$, $P_2$ or $P_4$, is then introduced in situ at a temperature $T_c$, which temperature is lower than the optimal growth temperature for epitaxy of the crystal which is to be grown. Temperature $T_c$ may vary from about 30° C. to about 250° C. In this step, and as illustrated by FIG. 4, a vapor 13 comprising a group-V species is introduced onto the surface of the substrate 7 by opening shutter 19. When the temperature $T_s$ of the substrate 7 is appropriately low (between about 30° C. and about 250° C.), and the pressure $P_c$ of the group-V vapor 13 is adequate (about 0.004 pa to about 0.012 pa), condensation of the group-V species on the substrate 7 takes place. The thickness of the layer 11 of group-V species which condenses on the surface of the substrate 7, can be controlled by varying the temperature $T_s$ of the substrate 7. Indeed, the amount of desorption from the condensed layer of group-V species is dependent on the temperature. In other words, different thicknesses of the layer 11 can be achieved by varying the temperature $T_s$. The temperature $T_s$ of the substrate 7 is preferably set such that the thickness of the layer of the group-V species falls into a range of several Å to a few tens of Å. The desired thickness of the layer 11 is achieved as soon as the temperature $T_s$ is reached, generally in a matter of seconds.

Step 3: Deposit of a Mono-Layer of Group-III Atoms on the Group-V Layer

Figure 5:
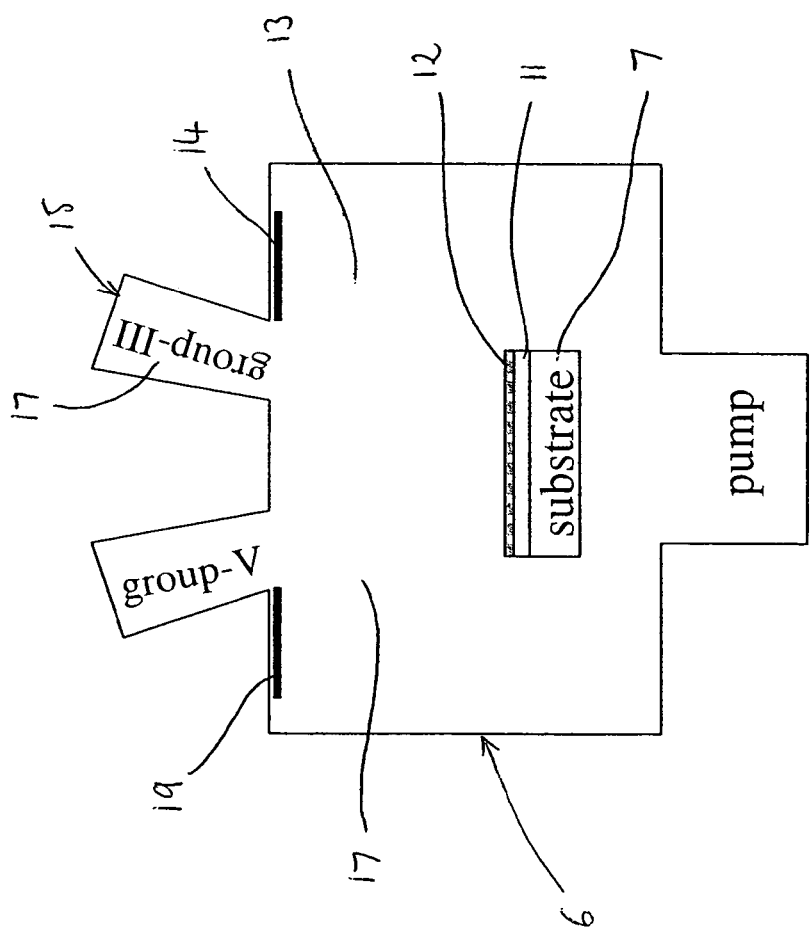
FIG. 5 is a schematic representation of the growth chamber illustrating the deposit of a second layer of group-III species over the first layer of group-V species.

A layer of group-III atoms 12 is then deposited over the group-V layer 11 previously deposited on the substrate 7, as illustrated by FIG. 5. This layer 12 may be have a thickness ranging from one atom to a few atoms. In the preferred embodiment, the layer 12 is a mono-layer of group-III atoms. The layer of group-III atoms 12 may comprise In, Ga, Al or any combination of Ga, Al and In. The deposit may be made by opening, for an appropriate duration of time (between about 1 second and about 3 seconds) the shutter 14 of the furnace 15 containing a vapor of group-III atoms 17. This duration of time may vary according to the geometry of the shutter 14 and furnace 15, and the evaporation rate of the group-III atoms introduced. The vapor of group-III atoms is introduced at a temperature ranging from about 780° C. to about 1250° C. and at a pressure of about $5 \times 10^{-5}$ pa. In atoms are preferably introduced at a temperature of about 780° C., Ga atoms are preferably introduced at a temperature of about 900° C., and Al atoms are preferably introduced at a temperature of about 1200° C.

After introduction of the vapor of group-III atoms 17 in the growth chamber 6, the vapor of group-III atoms 17 condenses on the surface of the substrate 7 above the layer of group-V atoms 11, forming a mono-layer of group-III atoms 12. At this stage the substrate 7 is kept at a temperature $T_d$ ranging from about 30° C. to about 250° C. and the pressure of the group-V vapor 13 which was introduced in step 2 is maintained around 0.008 pa. The mono-layer of group-III atoms 12, is then annealed by raising the temperature of the substrate $T_d$ to a temperature from about 400° C. to about 580° C., under a pressure of group-V vapor 13 of about 0.008 pa. Such mono-layer of group-III atoms 12 has the property of changing the desorption tendency of the group-V species layer 11 lying underneath, and allows retention of the group-V species layer 11 during the annealing phase, which precedes the actual epitaxial growth of the crystal at an optimal growth temperature. The group-III atoms in the mono-layer 12 will seek lattice sites of a lower free energy during annealing, and will therefore form a propitious starting atomic plane for subsequent epitaxial growth. Because the bonding, between group-V molecules in the thin condensed layer 11 initially deposited, is much weaker than that between atoms of the solid crystal to be grown, the group-V molecules will relocate during the subsequent epitaxy to accommodate the lattice mismatch between the solid substrate crystal 7 and the desired solid crystal over-layer.

Step 4: Epitaxial Growth of Crystal

Figure 6:
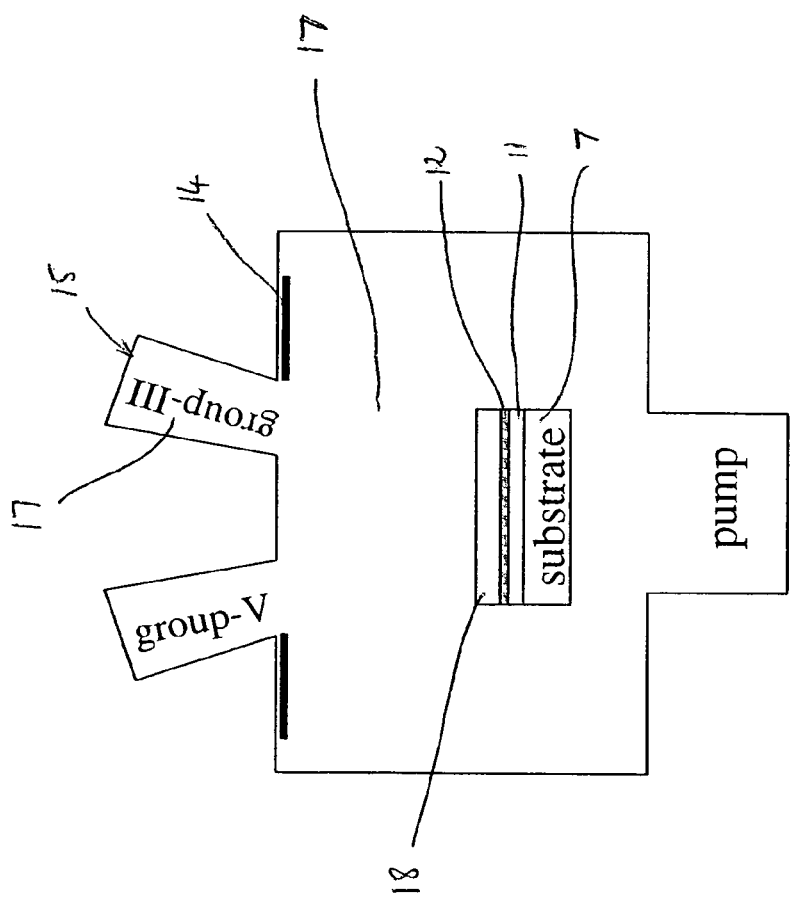
FIG. 6 is a schematic representation of the growth chamber illustrating the epitaxial growth of a crystal over the second layer.

Growth of bulk group III-V species layer 18 may then be initiated by opening again the shutter 14 of the group-III furnace 15 as illustrated by FIG. 6. Such group III-V species layer 18 may include InAs, $In_xGa_{1-x}As$, $In_xAl_{1-x}As$ or GaP, but other group III-V species may be contemplated as well. In a preferred embodiment, group-V species and group-III species are introduced in the growth chamber with the ratio of the group-V flux to the group-III flux being maintained in the range of about 1.5 to about 3.

For the purpose of illustration, the method of growing a group III-V crystal on top of another group III-V crystal, without introducing lattice-mismatch defects, is described in the particular example where the substrate is GaAs, the thin-layer of group-V species is $As_2$, the mono-layer of group-III atoms is indium, and the crystal epitaxially grown is InAs. This method comprises the following steps:

Step 1: Thermal Desorption Cleaning of the Substrate

In one embodiment of this invention, a GaAs substrate 7 is heated to about 600° C. and annealed for about 10 minutes under an $As_2$ vapor 8 at a pressure of about 0.008 pa, which pressure is larger than the vapor pressure of GaAs at 600° C.

Step 2: In situ Introduction of Condensed Group-V Species

In this step, the temperature of the substrate 7 is first allowed to drop or is cooled to about 110° C. while the substrate 7 is subjected to an $As_2$ vapor pressure 13 of about 0.008 pa, so that a condensed layer 11 of $As_2$ is formed on the surface of the substrate 7. The $As_2$ condensed layer 11 is then thinned down to the desired thickness, which thickness is preferably around several tens of Å or less, by then raising the temperature of the substrate 7 to about 250° C.

Step 3: Deposit of a Mono-Layer of Group-III Atoms on the Group-V Layer

In this exemplary embodiment, the desired number of group-III atoms per surface area forming the mono-layer is approximately 6.5 e14 cm$^{-2}$. The shutter 14 of the furnace 15 is opened to introduce indium vapor 17 at 790° C. so that a mono-layer of indium 12 is deposited over the condensed As$_2$ layer 11. When the group-III flux incident on the growth surface is about 6.5 e14/2.2 cm$^{-2}$s$^{-1}$, the shutter is preferably opened for 2.2 seconds in order to obtain the desired mono-layer of 6.5 e14 cm$^{-2}$ group-III atoms. The substrate temperature is kept at about 250° C. while still being subjected to a pressure of As$_2$ vapor 13 of about 0.008 pa. The temperature of the substrate 7 is then raised to about 400° C. while the As$_2$ pressure 13 inside the growth chamber is maintained around 0.008 pa. The mono-layer of indium 12 is annealed when the substrate temperature ramps from about 250° C. to about 400° C. After this step, the conditions are propitious for epitaxial growth of InAs, without introducing dislocation defects due to lattice mismatch between the GaAs substrate and the InAs crystal.

Step 4: Epitaxial Growth of Crystal

Growth of bulk InAs layer 18 may then be initiated by reopening the shutter 14 of the indium furnace 15. The temperature is maintained at the optimal epitaxial growth temperature for InAs, between about 400° C. and about 450° C., while the ratio of the group-V flux to the group-III flux introduced, is preferably maintained around 2.5.

In the methods described above, the substrate 7 may be heated in any way known in the art, including through contact heat diffusion or radiation heat transfer. In one embodiment, a tantalum filament is heated up by inducing an electrical current through the filament. The filament is preferably disposed adjacent the back of the substrate, such that the heated filament radiates energy to the substrate. Heat shields may be disposed under both the substrate and the filament in such a way that most of the heat radiated by the filament is efficiently transmitted to the substrate.

A pump 20 may be used throughout the steps of the methods of the present invention in order to rid the growth chamber of unwanted residual vapors, including surface oxides.

Figure 7:
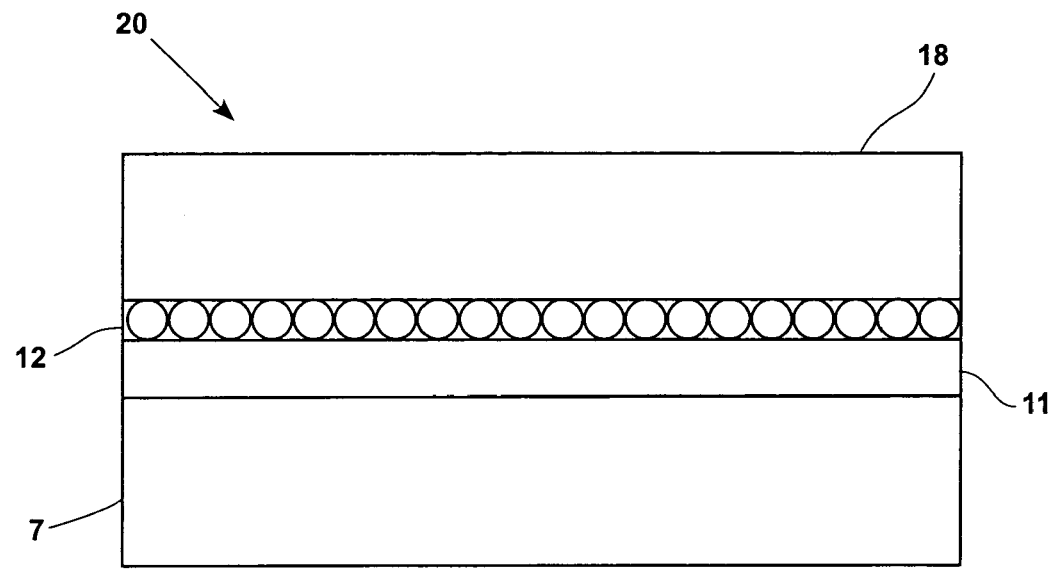
FIG. 7 is a schematic representation of a semiconductor device in accordance with this invention.
Figure 8:
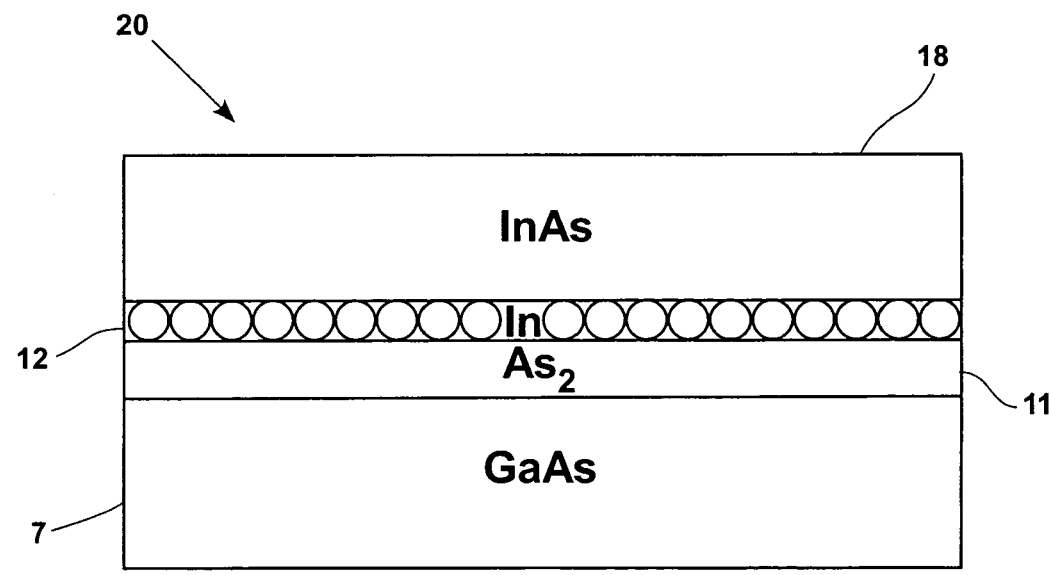
FIG. 8 is a schematic representation illustrating an exemplary embodiment of a semiconductor device in accordance with this invention.

In another aspect, the present invention relates to a semiconductor device as shown in FIG. 7. The semiconductor 20 comprises a substrate 7 of a group-III/group-V material, a layer 11 of group-V material disposed over the substrate 7, a mono-layer 12 of group-III atoms disposed over the layer 11, and a layer 18 of epitaxially grown group-III/group-V crystal disposed over the mono-layer 12. In an exemplary embodiment of the semiconductor device 20 shown in FIG. 8, the substrate 7 is GaAs, the layer 11 is As$_2$, the mono-layer 12 is In, and the crystal 18 is InAs.

Even though the present invention is described in connection with specific group-III and group-V elements, any combination of these elements may be used.

Having described the invention in connection with certain embodiments thereof, modifications will certainly suggest themselves to those skilled in the art. As such, the invention is not to be limited to the disclosed embodiments except as required by the appended claims.

The invention claimed is:

1. A semiconductor device comprising:
   a first layer of a first material;
   a second layer of a second material disposed over the first layer;
   a third layer of a third material disposed over the second layer; and
   a fourth layer of a fourth material disposed over the third layer;
   wherein the fourth layer is epitaxially grown,
   wherein the second layer substantially accommodates strain accumulated between the first material and the fourth material during epitaxial growth of the fourth layer, thereby substantially preventing strain relaxation and formation of dislocation defects, and
   wherein:
   the first material is a group-III/group-V material;
   the second material is a group-V material;
   the third material is a group-III material; and
   the fourth material is a group-III/group-V material.

2. The semiconductor device of claim 1, wherein:
   the first material is selected from the group consisting of GaAs GaP, InAs and InP;
   the second material is selected from the group consisting of As$_2$, As$_4$, P$_2$ and P$_4$;
   the third material is selected from the group consisting of In, Ga and Al or any combination thereof; and
   the fourth material is selected from the group consisting of InAs, In$_x$Ga$_{1-x}$As, In$_x$Al$_{1-x}$As or GaP.

3. The semiconductor device of claim 2, wherein: the second layer has a thickness ranging from a few Å to a few tens of Å; and the third layer is substantially a mono-layer of atoms.

4. The semiconductor device of claim 1, wherein the second layer of the second material is disposed immediately adjacent the first layer.

5. The semiconductor device of claim 1, wherein the third layer of the third material has a thickness substantially equal to a monolayer of atoms and is disposed immediately adjacent the second layer.

6. The semiconductor device of claim 1, wherein the fourth layer of the fourth material is disposed immediately adjacent the third layer.

7. A semiconductor device comprising:
   a first layer of a first material, wherein the first material is GaAs;
   a second layer of a second material disposed over the first layer, wherein the second material is As$_2$;
   a third layer of a third material disposed over the second layer, wherein the third layer is a mono-layer of In atoms; and
   a fourth layer of a fourth material disposed over the third layer, wherein the fourth material is InAs; wherein the fourth layer is epitaxially grown, and wherein the second layer substantially accommodates strain accumulated between the first material and the fourth material during epitaxial growth of the fourth layer, thereby substantially preventing strain relaxation and formation of dislocation defects.

8. A semiconductor device comprising:
   a first layer of a first material;
   a second layer of a second material disposed over the first layer, the second material being selected from a single group of the periodic table;
   a third layer of a third material disposed over the second layer, the third material being selected from another single group of the periodic table, said another single group of the periodic table which being a different group of the periodic table than said first mentioned single group of the periodic table; and
   a fourth layer of a fourth material disposed over the third layer; wherein the fourth layer is epitaxially grown, and wherein the second layer substantially accommodates strain accumulated between the first material and the fourth material during epitaxial growth of the fourth layer, thereby substantially preventing strain relaxation and formation of dislocation defects and wherein:

the first material is a group-III/group-V material;

the second material is a group-V material;

the third material is a group-III material; and the fourth material is a group-III/group-V material.

9. The semiconductor device of claim 8, wherein:

the first material is selected from the group consisting of GaAs GaP, InAs and InP;

the second material is selected from the group consisting of $As_2$, $As_4$, $P_2$ and $P_4$;

the third material is selected from the group consisting of In, Ga and Al or any combination thereof; and the fourth material is selected from the group consisting of InAs, $In_xGa_{1-x}As$, $In_xAl_{1-x}As$ or GaP.

10. The semiconductor device of claim 9, wherein: the second layer has a thickness ranging from a few Å to a few tens of Å; and the third layer is substantially a mono-layer of atoms.

11. The semiconductor device of claim 8, wherein:

the first material is selected from the group consisting of GaAs GaP, InAs and InP; and the second material is selected from the group consisting of $As_2$, $As_4$, $P_2$ and $P_4$.

12. The semiconductor device of claim 11, wherein:

the third material is selected from the group consisting of In, Ga and Al or any combination thereof; and the fourth material is selected from the group consisting of InAs, $In_xGa_{1-x}As$, $In_xAl_{1-x}As$ or GaP.

13. The semiconductor device of claim 8, wherein:

the first material is selected from the group consisting of GaAs GaP, InAs and InP; and the fourth material is selected from the group consisting of InAs, $In_xGa_{1-x}As$, $In_xAl_{1-x}As$ or GaP.

14. The semiconductor device of claim 13, wherein:

the second material is selected from the group consisting of $As_2$, $As_4$, $P_2$ and $P_4$; and the third material is selected from the group consisting of In, Ga and Al or any combination thereof.

15. The semiconductor device of claim 8, wherein the second layer of the second material is disposed immediately adjacent the first layer.

16. The semiconductor device of claim 8, wherein the third layer of the third material has a thickness substantially equal to a monolayer of atoms and is disposed immediately adjacent the second layer.

17. The semiconductor device of claim 8, wherein the fourth layer of the fourth material is disposed immediately adjacent the third layer.

* * * * *